(12) United States Patent
Stein et al.

(10) Patent No.: US 9,148,162 B2
(45) Date of Patent: Sep. 29, 2015

(54) DIGITAL DOWN CONVERTER WITH EQUALIZATION

(71) Applicant: Guzik Technical Enterprises, Mountain View, CA (US)

(72) Inventors: Anatoli B. Stein, Atherton, CA (US); Semen P. Volfbeyn, Palo Alto, CA (US)

(73) Assignee: GUZIK TECHNICAL ENTERPRISES, Mountain View, CA (US)

( * ) Notice: Subject to any disclaimer, the term of this patent is extended or adjusted under 35 U.S.C. 154(b) by 0 days.

(21) Appl. No.: 14/595,396

(22) Filed: Jan. 13, 2015

(65) Prior Publication Data

US 2015/0200679 A1 Jul. 16, 2015

Related U.S. Application Data

(60) Provisional application No. 61/927,770, filed on Jan. 15, 2014.

(51) Int. Cl.
| | |
|---|---|
| *H03M 1/12* | (2006.01) |
| *H04L 27/01* | (2006.01) |
| *H03M 1/06* | (2006.01) |
| *H03M 1/08* | (2006.01) |

(52) U.S. Cl.
CPC .......... *H03M 1/1215* (2013.01); *H03M 1/0626* (2013.01); *H03M 1/0836* (2013.01); *H04L 27/01* (2013.01)

(58) Field of Classification Search
USPC .................................................. 375/235, 350
See application file for complete search history.

(56) References Cited

U.S. PATENT DOCUMENTS

| | | | | |
|---|---|---|---|---|
| 4,594,725 | A * | 6/1986 | Desperben et al. | 375/235 |
| 5,057,786 | A * | 10/1991 | Yoshikawa | 329/304 |
| 5,239,299 | A * | 8/1993 | Apple et al. | 341/118 |
| 6,324,559 | B1 * | 11/2001 | Hellberg | 708/321 |
| 7,408,495 | B2 | 8/2008 | Stein et al. | |
| 7,881,405 | B2 * | 2/2011 | Menkhoff | 375/316 |
| 8,711,993 | B2 * | 4/2014 | Malaga et al. | 375/350 |
| 2006/0290546 | A1 * | 12/2006 | Phillips et al. | 341/119 |

OTHER PUBLICATIONS

Product flyer DC-1909 Digital Down Converter, CAPS Inc., http://www.caps.com, Dec. 3, 2007, internet URL http://capsrad.com/images/CAPS_DC-1901fill.pdf.*
J.G.Proakis and D.G.Manolakis, "Digital Signal Processing, Principles, Algorithms, and Applications", Third Edition, Prentice Hall, 1996, pp. 794-795.

* cited by examiner

*Primary Examiner* — Howard Williams
(74) *Attorney, Agent, or Firm* — Burns & Levinson LLP; Joseph M. Maraia

(57) ABSTRACT

A digital down converter with equalization includes an analog to digital converter (ADC), a frequency divider, an FIR-decimator-I, an FIR-decimator-Q and a frequency corrector. In operation, after some preprocessing, the FIR-decimator-I performs signal transformation equivalent to a sequence of equalization, multiplication of the processed signal by a sine wave of a conversion frequency and low pass filtering, and the FIR-decimator-Q performs signal transformation equivalent to a sequence of equalization, multiplication of the processed signal by a sine wave of conversion frequency with a phase shift of 90° and low pas filtering. The transformed signals are applied to the frequency corrector, which provides a frequency shift of predetermined value with respect to a nominal carrier frequency of the applied analog input signal and generates an In-Phase output and a Quadrature output.

9 Claims, 3 Drawing Sheets

DIGITAL DOWN CONVERTER WITH EQUALIZATION

RELATED APPLICATIONS

This application claims the benefit of U.S. Provisional Application No. 61/927,770, filed on Jan. 15, 2014, and entitled, "DIGITAL DOWN CONVERTER WITH EQUALIZATION," the entirety of which is incorporated herein by reference.

FIELD OF THE TECHNOLOGY

The technology relates to high speed analog-to-digital converters (ADC) and, more particularly, to ADC digital equalization in frequency down converters intended for wireless receivers.

BACKGROUND

Down converters in wireless receivers perform a transformation of a radio frequency (RF) signal into a baseband signal centered at the zero frequency. In high performance equipment, digital down converters are used, making it necessary to convert an analog RF signal into a digital signal. Typically, a high speed ADC is used because of the high frequency of the RF signal.

High speed analog to digital converters are built as composite ADCs that consist of a number of interleaved sub-ADCs with a common input and sequential timing. In general, the amplitude and phase frequency responses of the different sub-ADCs are not identical, resulting in specific signal distortions, for example, the appearance of spurious frequency components. To prevent these distortions, equalization of the responses of the sub-ADCs is used (see, for example, U.S. Pat. No. 7,408,495).

A block diagram of a conventional digital down converter with an equalizer, is shown in FIG. 1. An RF signal applied to the input of an ADC, is transformed into a digital signal. The misalignment of the frequency responses of the sub-ADCs of the ADC, is corrected by an equalizer. An I/Q demodulator is constructed using two mixers with the same local oscillator frequency and with a phase difference of 90□. Low pass filters with following decimators produce two outputs labeled In-Phase (I) and Quadrature (Q).

The ADC equalizer and low pass filters in the block diagram of FIG. 1 are built usually as a conventional finite impulse response (FIR) filter. The most resource-consuming components of FIR filter are multipliers. Because of the difference between the RF signal frequency (usually several GHz) and the frequency of operation of present-day FPGA (up to 200-250 MHz), each multiplication in the FIR filter is carried out by a group of multipliers connected in parallel. The required number of multipliers becomes the main reason that makes it necessary to use in the equalizer design, more FPGAs and/or FPGAs of bigger size or, in some cases, makes the real time equalizer design impossible.

In a WiGig LAN communication system, it is suggested, for example, to use a super-heterodyne architecture with an intermediate frequency of 5.8 GHz. To process signals in such a frequency range, an ADC of a down converter should have a sample rate of 20 Gs/s or higher. With an FPGA frequency of operation of 200 MHz, each multiplication in an FIR filter requires 20000/200=100 multipliers operating in parallel, with an average length of an equalizer having about 80 taps. This means that implementing an equalizer requires 80×100=8000 multipliers. Such a number exceeds the resources of any available FPGA, with a consequence that a real time digital down converter under those described conditions is not possible.

It is possible to reduce to some extent, the required number of multipliers in the conventional down converter, of the type shown in FIG. 1, by embedding decimation within low pass filters between a shift register of an FIR filter and the multipliers (see, for example, J. G. Proakis and D. G. Manolakis, "Digital signal processing", p. 794). In such a design, the multiplications in the low pass filters are performed at lower sampling rates, with a consequent possibility to cut down the required number of multipliers. However, the amount of multipliers in the equalizer far exceeds the amount of multipliers in the low pass filters. For this reason, a reduction of the number of multipliers only in the filters, does not lead to a substantial decrease of the total number of multipliers in the down converter. In the block diagram of FIG. 1, equalization is carried out before down conversion by a unit that is common for both branches I and Q.

SUMMARY

The present technology provides a digital down converter with equalization, where multiplications are performed at relatively low sampling rates, and in that way, correspondingly reducing the required number of multipliers.

According to a form of the present technology, equalization is combined with down conversion and performed in an in-phase branch and a quadrature branch separately. Furthermore, the cascade-connected units in each branch (equalizer, mixers/multipliers and low pass filter) are replaced by a single equivalent FIR filter. A decimator is placed inside that FIR filter before the multipliers. As a result, the frequency of each multiplication in the down converter is lowered and the number of required multipliers is reduced significantly.

In a form, a digital down converter comprises an analog to digital converter (ADC), a frequency divider, an in-phase finite impulse response filter/decimator ("FIR-decimator-I"), a quadrature finite impulse response filter/decimator ("FIR-decimator-Q") and a frequency corrector.

The analog to digital converter (ADC), preferably, a composite ADC, has an ADC signal input for receiving an applied analog signal, and an ADC sampling clock input for receiving an applied ADC sampling clock signal characterized by a full rate (FR) clock frequency. The ADC also has an ADC output. The ADC is responsive to the applied analog signal and the ADC sampling clock signal to provide at the ADC output, an ADC digital signal representative of the applied analog signal.

The frequency divider (FD) has an FD input connected to the ADC sampling clock input, and an FD output. The frequency divider is responsive to the ADC sampling clock to provide at the FD output, a low rate (LR) clock signal characterized by an LR clock frequency corresponding to the FR clock frequency divided by a decimation factor.

The FIR-decimator-I has an I-signal input connected to the ADC output, and an FIR-decimator-I output. The FIR-decimator-I further has an FIR-decimator-I low frequency clock input connected to the FD output, and an FIR-decimator-I sampling clock input for receiving the ADC sampling clock signal. The FIR-decimator-I is responsive to the ADC digital signal, the ADC sampling clock signal and the LR clock signal, to provide at the FIR-decimator-I output, an I-transformed signal corresponding to the ADC digital signal as transformed by a sequence of equalization, multiplication of the equalized signal by a sine wave of a conversion frequency Fc with a phase shift of 0°, and low pass filtering.

The FIR-decimator-Q has a Q-signal input connected to the ADC output, and an FIR-decimator-Q output. The FIR-decimator-Q further has an FIR-decimator-Q low frequency clock input connected to the FD output, and an FIR-decimator-Q sampling clock input for receiving the ADC sampling clock signal. The FIR-decimator-Q is responsive to the ADC digital signal, the ADC sampling clock signal, and the LR clock signal, to provide at the FIR-decimator-Q output, a Q-transformed signal corresponding to the ADC digital signal as transformed by a sequence of equalization, multiplication of the equalized signal by a sine wave of a conversion frequency Fc with a phase shift of 90° and low pass filtering.

The frequency corrector (FC) has an FC-I input connected to the FIR-decimator-I output, an FC-Q input connected to the FIR-decimator-Q output, an FC-I output and an FC-Q output. The frequency corrector provides an In-Phase I-output signal at the FC-I output and a Quadrature Q-output signal at the FC-Q output. A signal with the components of I-output and Q-output is characterized by a frequency shift of predetermined value with respect to a nominal value of a carrier frequency of the applied analog input signal.

In a form, the FIR-decimator-I and the FIR-decimator-Q are each characterized by an associated set of coefficients determined in accordance with the following steps:

a. calculation of a first auxiliary set of coefficients as coefficients of an FIR filter that would perform a specified equalization;
b. calculation of a second auxiliary set of coefficients as coefficients of an FIR filter that would multiply the processed signal by a sine wave of the conversion frequency with a phase shift of 0°;
c. calculation of a third auxiliary set of coefficients as coefficients of an FIR filter that would multiply the equalized signal by a sine wave of the conversion frequency with a phase shift of 90°;
d. calculation of a fourth auxiliary set of coefficients as coefficients of an FIR filter that would have a frequency response of a low pass filter;
e. calculation of coefficients of the FIR-decimator-I as a convolution of the first auxiliary set of coefficients, the second auxiliary set of coefficients and the fourth auxiliary set of coefficients; and
f. calculation of coefficients of the FIR-decimator-Q as a convolution of the first auxiliary set of coefficients, the third auxiliary set of coefficients and the fourth auxiliary set of coefficients.

In a form, the FIR-decimator-I and the FIR-decimator-Q each contain a decimator disposed along a signal path before multipliers of the respective FIR-decimator-I and FIR-decimator-Q.

In a form, the conversion frequency in the FIR-decimator-I and in the FIR-decimator-Q is chosen to be equal the product of the frequency of the sampling clock and a ratio of two integers. In that form, the frequency corrector may shift the frequency of the signal at the output of the digital down converter by a value that equals the difference between a nominal value of a carrier frequency of the input signal and the conversion frequency in the FIR-decimator-I and in the FIR-decimator-Q.

DETAILED DESCRIPTION

Figure 1:
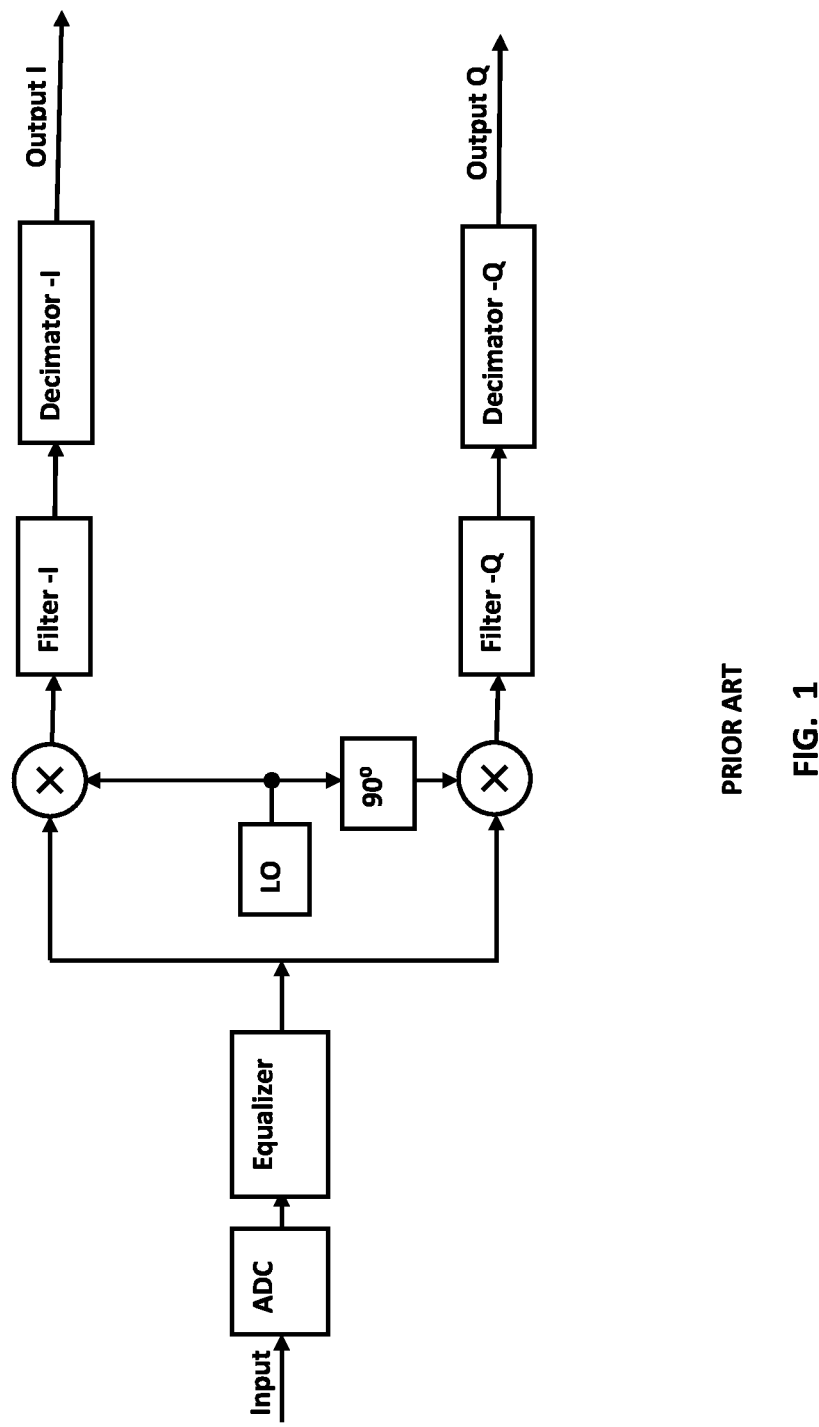
FIG. 1 depicts s a conventional down converter with equalization (prior art)
Figure 2:
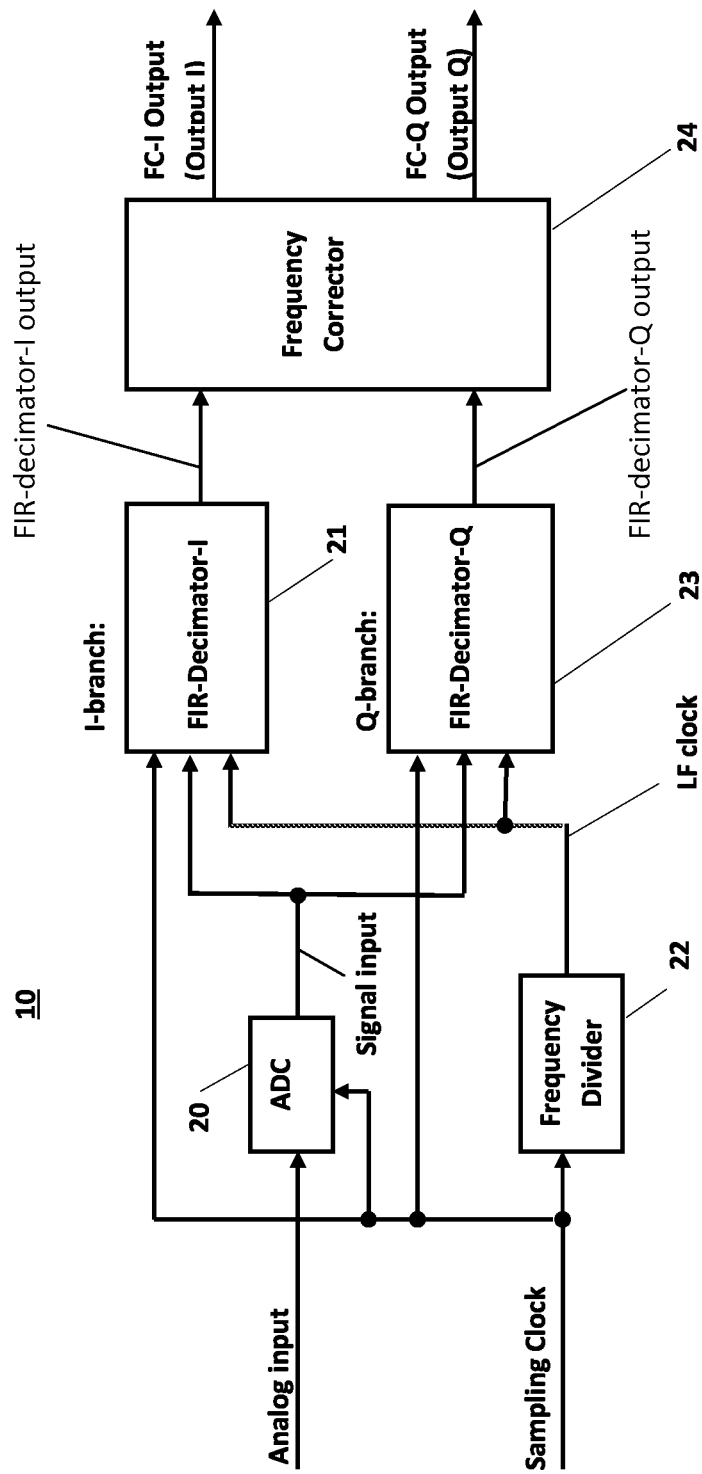
FIG. 2 depicts an exemplary digital down converter with equalization according to the present technology.

A block diagram of a digital down converter 10 with equalization in accordance with an exemplary embodiment of the present technology, is shown in FIG. 2. The down converter 10 carries out several operations:

i. It performs equalization to (a) correct misalignment of frequency responses of sub-ADCs in a composite ADC, and (b) shape the frequency response of the ADC as a whole in compliance with specified requirements.
ii. It fulfills conversion of an RF input signal into a baseband output signal, where that operation consists of two parts: (a) multiplication of the processed signal by a sine wave of the conversion frequency (with a phase shift of 90° in the branch that produces the quadrature output Q), and (b) low pass filtering to suppress high frequency components created at the first stage.
iii. It, finally, makes use of the transfer to a baseband frequency range and reduces the sampling rate of the output signal by a decimation.

The block diagram of digital down converter 10 in FIG. 2 has an analog input, a sampling clock input and two outputs: output I and output Q. Digital down converter 10 comprises an analog to digital converter (ADC) 20, a frequency divider 22, two FIR filters with time variant coefficients and built-in decimator: FIR-decimator-I 21 (in an in-phase or I-branch) and FIR-decimator-Q 23 (in a quadrature phase or Q-branch), and a frequency corrector 24. The analog to digital converter 20 transforms the input analog signal into a digital signal. The frequency divider 22 receives the sampling clock and produces a low frequency clock (LF Clock) with a frequency that equals the frequency of the sampling clock divided by a decimation factor.

Figure 3:
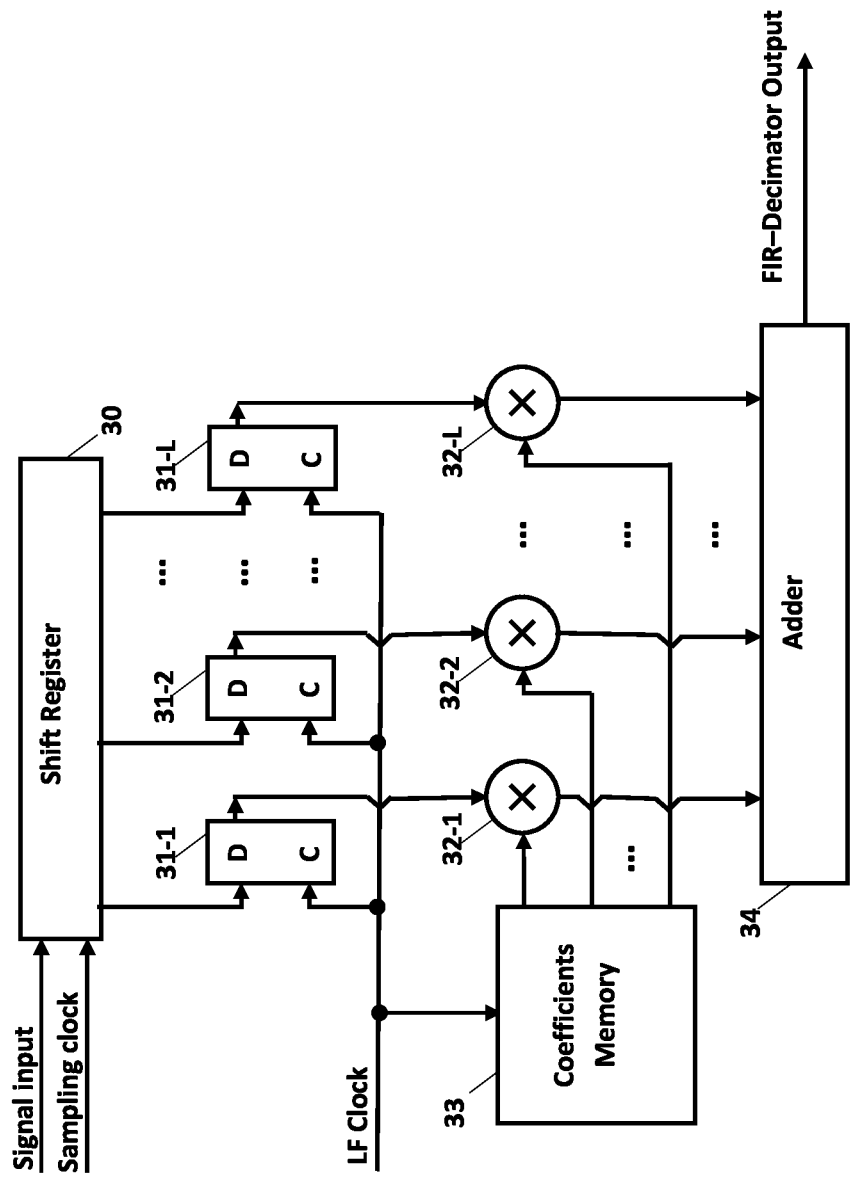
FIG. 3 depicts a block diagram of an exemplary FIR with a built-in decimator, of the down convertor of FIG. 2.

In each of the I-branch and the Q-branch, a decimator characterized by a decimation factor, is disposed inside its respective FIR-decimator (-I and -Q) along the signal path prior to the multipliers, resulting in reduction of the frequency of performed multiplications. An exemplary form of each FIR-decimator is constructed, for example, according to the block diagram in FIG. 3. In FIG. 3, a shift register 30, a coefficients memory 33, multipliers (32-1, . . . , 32-L) and an adder 34 are components corresponding to conventional parts of an FIR. The sample storage units 31-1, . . . , 31-L form a decimator, where L is an integer less than the number of stages in shift register 30. At each positive transition in the LF Clock, samples from the shift register 30 are loaded into the sample storage units 31-1, . . . , 31-L and are kept there for a number of sampling clock periods, this number being equal to the decimation factor. During the corresponding time interval, the multipliers 32-1, . . . , 32-L with the adder 34, perform calculations and form the output sample. In that way, the time interval assigned for multiplications is increased by the decimation factor.

The frequency corrector 24 in the block diagram of FIG. 2, receives from FIR-decimator-I 21 and FIR-decimator-Q 23, I and Q components of the baseband signal, and shifts that signal in the frequency domain by a predetermined (or specified) amount $\Delta F$. Units of this kind are well known in the art and usually are built in accordance with the following equations that relate the outputs of the unit (Output I(t) and output Q(t)) to the inputs (Input I(t) and Input Q(t)):

Output $I(t)$=Input $I(t) \cdot \cos(2 \cdot \pi \cdot \Delta F \cdot t)$−Input $Q(t) \cdot \sin(2 \cdot \pi \cdot \Delta F \cdot t)$,   i.

Output $Q(t)$=Input $I(t)\cdot\sin(2\pi\cdot\Delta F\cdot t)$+Input $Q(t)\cdot\cos(2\pi\cdot\Delta F\cdot t)$. ii.

Successful operation of the digital down converter with equalization 10 is achieved by loading into the FIR-decimator-I 21 and FIR-decimator-Q 23 properly calculated coefficients. According to an embodiment of the present technology, the calculation of these coefficients is carried out in two steps:
  i. At the first step, coefficients of three hypothetical FIRs are calculated: the coefficients of a hypothetical equalizer, the coefficients of a hypothetical FIR that performs multiplication of the processed signal by a sine wave of the conversion frequency, and the coefficients of a hypothetical low pass filter; and
  ii. At the second step, the coefficients of FIR-decimator-I and FIR-decimator-Q are found by calculation the convolution of the three sets of coefficients that describe the aforesaid hypothetical FIRs.

The coefficients of the hypothetical equalizer are calculated in the usual way. Initially, the frequency responses of sub-ADCs that make up the composite ADC, are measured. Then, all subsets of coefficients corresponding to different sub-ADCs are found, either by discrete Fourier transform or according to the method of least squares if the number of frequencies where frequency responses were measured, exceeds the specified length of the equalizer.

The multiplication of the processed signal by a sine wave of a conversion frequency Fc, is fulfilled by a hypothetical FIR filter that has one tap (one multiplier) and coefficients $C[n]$ that vary in time according to the equations:

$C[n]=\sin(2\pi\cdot Fc\cdot n/Fs)$ in branch $I$ and        i.

$C[n]=\cos(2\pi\cdot Fc\cdot n/Fs)$ in branch $Q$,        ii.

where Fc is the conversion frequency, Fs is the frequency of the sampling clock, and n is the number of the current sample. When the multiplication of the processed signal is done by an FIR, a local oscillator (LO) is not needed: the information of the sine wave of conversion frequency is enclosed in the coefficients sequence $C[n]$. There is, however, a restriction: the size of coefficients memory in an FIR is limited, and therefore the number of different coefficients $C[n]$ is finite. This condition is met only if the sequence $C[n]$ is periodical, which is true if the ratio of the conversion frequency Fc to the frequency of the sampling clock Fs equals a ratio of two integers:

$Fc/Fs=M/N$, where $M$ and $N$ are integers.

In a form, the required frequency response of the hypothetical low pass filter is determined by the properties of a wireless receiver that contains a digital down converter with equalization of the technology. The width of frequency band occupied by an RF signal, determines the passband of the low frequency filter. High frequency components produced during multiplication of the processed signal by a sine wave, and noise that should be suppressed, determine the filter stopband. When frequency response of the hypothetical low pass filter is determined, its coefficients are calculated by conventional techniques.

Since the coefficients of FIR-decimator-I and FIR-decimator-Q are found by calculation of the convolution of the hypothetical FIR filters coefficients, each of these units is equivalent to a cascade connection of the correspondent three hypothetical FIR filters. For this reason, the performance of the digital down converter with equalization according to the present technology, is similar to the performance of the conventional down converter: if the same RF signal is applied to the input of a conventional down converter and to the input of the down converter with equalization of the present technology, then the output signals of these two devices coincide likewise. At the same time all multiplications of the digital down converter with equalization according to the present technology, are carried out at a frequency that equals the sampling frequency divided by the decimation factor.

In the above-mentioned example of a WiGig communication system, the bandwidth of the demodulated signals (I and Q components at the outputs of the down converter) is determined as 1.1 GHz. Signals of such bandwidth may be processed, for example, with a decimated sample rate of 4 Gs/s. It means, that with the same FPGA frequency of operation 200 MHZ as before, each multiplication in an FIR filter requires 4000/200=20 multipliers operating in parallel. For a length of equalizer equal to 80 taps, each branch of digital down converter requires for implementation 80×20=1600 multipliers or 2×1600=3200 multipliers in total. Such a number of multipliers is available, for example, in a FPGA 5SGD6 of the Stratix V family. Hence, the present technology opens the way to design a real time digital down converter with equalization for WiGig specification, whereas it was impossible previously.

One skilled in the art will realize the technology may be embodied in other specific forms without departing from the spirit or essential characteristics thereof. The foregoing embodiments are therefore to be considered in all respects illustrative rather than limiting of the technology described herein. The scope of the technology is thus indicated by the appended claims, rather than by the foregoing description, and all changes that come within the meaning and range of equivalency of the claims are therefore intended to be embraced therein.

What is claimed is:

1. A digital down converter comprising:
  A. an analog to digital converter (ADC) having an ADC signal input for receiving an applied analog signal, an ADC sampling clock input for receiving an applied ADC sampling clock signal characterized by a full rate (FR) clock frequency, and an ADC output, wherein the ADC is responsive to the applied analog signal and the ADC sampling clock signal to provide at the ADC output an ADC digital signal representative of the applied analog signal,
  B. a frequency divider (FD) having an FD input connected to the ADC sampling clock input, and an FD output, wherein the frequency divider is responsive to the ADC sampling clock to provide at the FD output a low rate (LR) clock signal characterized by an LR clock frequency corresponding to the FR clock frequency divided by a decimation factor,
  C. an in-phase finite impulse response filter/decimator (FIR-decimator-I) having an I-signal input connected to the ADC output, an FIR-decimator-I low frequency clock input connected to the FD output, an FIR-decimator-I sampling clock input for receiving the ADC sampling clock signal and an FIR-decimator-I output, wherein the FIR-decimator-I is responsive to the ADC digital signal, the ADC sampling clock signal and the LR clock signal, to provide at the FIR-decimator-I output, an I-transformed signal corresponding to the ADC digital signal as transformed by a sequence of equalization, multiplication of the equalized signal by a sine wave of a conversion frequency Fc with a phase shift of 0° and low pass filtering,
  D. a quadrature phase finite impulse response filter/decimator (FIR-decimator-Q) having a Q-signal input connected to the ADC output, an FIR-decimator-Q low frequency clock input connected to the FD output, an FIR-decimator-Q sampling clock input for receiving the ADC sampling clock signal and an FIR-decimator-Q output, wherein the FIR-decimator-Q is responsive to the ADC digital signal, the ADC sampling clock signal and the LR clock signal, to provide at the FIR-decimator-Q output a Q-transformed signal corresponding to the ADC digital signal as transformed by a sequence of equalization, multiplication of the equalized signal by a sine wave of a conversion frequency Fc with a phase shift of 90° and low pass filtering, and E. a frequency corrector (FC) having an FC-I input connected to the FIR-decimator-I output, an FC-Q input connected to the FIR-decimator-Q output, an FC-I output and an FC-Q output, wherein the frequency corrector provides an In-Phase I-output signal at the FC-I output and a Quadrature Q-output signal at the FC-Q output, and wherein a signal with the components I-output and Q-output is characterized by a frequency shift of predetermined value with respect to a nominal value of a carrier frequency of the applied analog input signal.

2. A digital down converter of claim 1, wherein the FIR-decimator-I and the FIR-decimator-Q are each characterized by an associated set of coefficients determined in accordance with the following steps:
 a. Calculation of a first auxiliary set of coefficients as coefficients of an FIR filter that would perform the specified equalization;
 b. Calculation of a second auxiliary set of coefficients as coefficients of an FIR filter that would multiply the processed signal by a sine wave of the conversion frequency with a phase shift of 0';
 c. Calculation of a third auxiliary set of coefficients as coefficients of an FIR filter that would multiply the equalized signal by a sine wave of the conversion frequency with a phase shift of 90°;
 d. Calculation of a fourth auxiliary set of coefficients as coefficients of an FIR filter that would have a frequency response of a low pass filter;
 e. Calculation of coefficients of the FIR-decimator-I as a convolution of the first auxiliary set of coefficients, the second auxiliary set of coefficients and the fourth auxiliary set of coefficients;
 f. Calculation of coefficients of the FIR-decimator-Q as a convolution of the first auxiliary set of coefficients, the third auxiliary set of coefficients and the fourth auxiliary set of coefficients.

3. A digital down converter of claim 1, wherein the FIR-decimator-I and the FIR-decimator-Q each contain a decimator inside, said decimators being disposed along a signal path before multipliers of the respective FIR-decimator-I and FIR-decimator-Q.

4. A digital down converter of claim 1, wherein the conversion frequency in the FIR-decimator-I and in the FIR-decimator-Q is chosen to be equal the product of the frequency of the sampling clock and a ratio of two integers.

5. A digital down converter of claim 4, wherein the frequency corrector shifts the frequency of the signal at the output of the digital down converter by a value that equals the difference between a nominal value of a carrier frequency of the input signal and the conversion frequency in the FIR-decimator-I and in the FIR-decimator-Q.

6. A digital down converter of claim 1, wherein the in-phase FIR-decimator-I and the quadrature FIR-decimator-Q each comprise:
 a. an n-stage shift register adapted to receive the ADC digital signal and shift the ADC digital signal from stage to stage in response to the applied ADC sampling clock signal,
 b. a decimator including L taps coupled to associated ones of the n stages of the shift register, and operative to clock out the values of the respective coupled L shift register stages response to the LR clock signal, where L is less than n,
 c. a coefficients memory operative to clock out a set of coefficient values in response to the LR clock signal,
 d. a multiplier coupled to the decimator and responsive to the LR clock signal, to multiply values clocked out of the decimator with respective coefficients clocked out of the coefficients memory, to generate a multiplied values for each of the values clocked out of the respective L shift register stages, and
 e. an adder responsive to the multiplied values to sum the multiplied values, to provide a succession of processed values corresponding to the output I and output Q of the respective In-Phase I-output signal and Quadrature Q-output signal.

7. A digital down converter of claim 1, wherein the ADC is a composite ADC including a plurality of sub-ADC, wherein each sub-ADC is characterized by an associated amplitude response and an associated phase response.

8. A digital down converter comprising:
 an analog to digital converter (ADC), a frequency divider, an in-phase FIR-decimator-I, a quadrature FIR-decimator-Q and a frequency corrector,
  wherein the analog to digital converter is responsive to an applied analog signal and an ADC sampling clock signal characterized by a full rate (FR) clock frequency, to provide an ADC digital signal representative of the applied analog signal,
  wherein the in-phase FIR-decimator-I and the quadrature FIR-decimator-Q are each responsive to the ADC digital signal, the ADC sampling clock signal and a low rate (LR) clock signal characterized by a frequency which is a sub-multiple of the FR clock frequency, to provide at FIR-decimator outputs of the respective in-phase FIR-decimator-I and the quadrature FIR-decimator-Q, respective I-transformed and Q-transformed signals corresponding to the ADC digital signal as transformed by a sequence of equalization, multiplication of the equalized signal by a sine wave of a conversion frequency Fc with phase shifts of 0° and 90° respectively, and low pass filtering, and
  wherein the frequency corrector (FC) is responsive to the respective I-transformed and Q-transformed signals to provide an In-Phase I-output signal and a Quadrature Q-output signal with components characterized by a frequency shift of predetermined value with respect to a nominal value of a carrier frequency of the applied analog input signal.

9. A digital down converter of claim 1, wherein the ADC is a composite ADC including a plurality of sub-ADC, wherein each sub-ADC is characterized by an associated amplitude response and an associated phase response.

* * * * *

UNITED STATES PATENT AND TRADEMARK OFFICE
CERTIFICATE OF CORRECTION

PATENT NO. : 9,148,162 B2
APPLICATION NO. : 14/595396
DATED : September 29, 2015
INVENTOR(S) : Anatoli B. Stein and Seme P. Volfbeyn It is certified that error appears in the above-identified patent and that said Letters Patent is hereby corrected as shown below:

In column 7, line 34 (claim 2), "0'" should read -- 90° --

Signed and Sealed this
Third Day of May, 2016

Michelle K. Lee
*Director of the United States Patent and Trademark Office*